United States Patent

Nayebi et al.

[11] Patent Number: 5,689,309
[45] Date of Patent: Nov. 18, 1997

[54] CONTROL CIRCUIT FOR MIXING TWO VIDEO SIGNALS

[75] Inventors: Mehrdad Nayebi, Palo Alto; Duc Trong Ngo; Steve Edwards, both of San Jose, all of Calif.

[73] Assignees: Sony Corporation, Japan; Sony Electronics, Inc., Park Ridge, N.J.

[21] Appl. No.: 584,924

[22] Filed: Jan. 11, 1996

[51] Int. Cl.[6] ............................................ H04N 9/74
[52] U.S. Cl. ..................... 348/584; 348/585; 348/590; 348/598
[58] Field of Search ........................ 348/584, 585, 348/590, 591, 598; H04N 9/74, 9/76

[56] References Cited

U.S. PATENT DOCUMENTS

| | | | |
|---|---|---|---|
| 4,404,583 | 9/1983 | Tatami | 358/13 |
| 4,794,457 | 12/1988 | Gillet . | |
| 5,068,626 | 11/1991 | Takagi et al. | 331/17 |
| 5,153,530 | 10/1992 | Takagi et al. | 331/17 |
| 5,233,316 | 8/1993 | Yamada et al. | 331/45 |

Primary Examiner—Sherrie Hsia
Attorney, Agent, or Firm—Haverstock & Associates

[57] ABSTRACT

A mixer control circuit generates content control signals which are used by a mixer circuit to control the content of an output signal. The output signal will include either an analog signal, a digital signal or a mixture of the analog and digital signals. The level of a digital content control signal corresponds to the percentage of the output signal which includes the digital signal. The level of an analog content control signal corresponds to the percentage of the output signal which includes the analog signal. When the output signal includes a mixture of the analog and digital signals, a differential pair and an external control voltage are used to specify the percentage of each signal to be included within the output signal. During a horizontal blanking period, when the signals are being mixed, the differential pair and the external control voltage are bypassed and only the analog signal is included within the output signal. When the output signal is to include only one of the signals, either analog or digital, the differential pair and the external control voltage are also bypassed. A switching network is used to control the generation of the content control signals. The switching network is controlled by a control logic circuit in response to the levels of two control signals and a horizontal blanking signal.

23 Claims, 6 Drawing Sheets

CONTROL CIRCUIT FOR MIXING TWO VIDEO SIGNALS

FIELD OF THE INVENTION

The present invention relates to the field of mixing two video signals together. In particular, the present invention relates to the field of controlling the mixing of two input signals in a predetermined ratio into a combined output signal.

BACKGROUND OF THE INVENTION

A composite video signal contains information which is used by a video system to generate a video picture on a display, monitor or television. A video picture or frame is made up of a number of horizontal lines included within the video display. To display a video picture or frame the video system begins at the top of the screen and displays the information within the composite video signal one horizontal line at a time. In many video transmission systems, color or chrominance information is represented by a particular phase of the chrominance subcarrier signal that is amplitude modulated with color information. The horizontal synchronization pulse is used by a phase-locked loop to synchronize the system for displaying the next horizontal line of video information. The burst signal is used to synchronize the phase of the sampling pulses with the phase of the color subcarrier signal.

Each period, within the horizontal portion of a composite video signal contains information representing one horizontal output line which is to be output on the video display, monitor or television. Each horizontal period includes a horizontal synchronization pulse, a burst signal and a video information signal. The information for each horizontal line is contained within a horizontal period of the composite video signal.

After each horizontal period, during a horizontal blanking period, the video system moves to the next line and prepares to display the information within the next horizontal period of the composite video system. This continues until the video system reaches the bottom line on the video display. After displaying the video information on the bottom line of the video display, the video system must reset itself to the top of the display in order to begin displaying the next frame. In order to allow the system to reset itself to the top of the video display a vertical blanking period is included within the composite video signal, after the video information for each frame. This vertical blanking period allows the video system to reset to the top of the video display and begin displaying the information for the horizontal lines of the next frame. Therefore, a number of horizontal periods, enough to comprise a frame or screen, are strung together, within the composite video signal. Between each frame, the composite video signal includes a vertical blanking period which allows the video system to perform a vertical reset and prepare to display the next frame by moving back up to the top of the video display.

Figure 1:
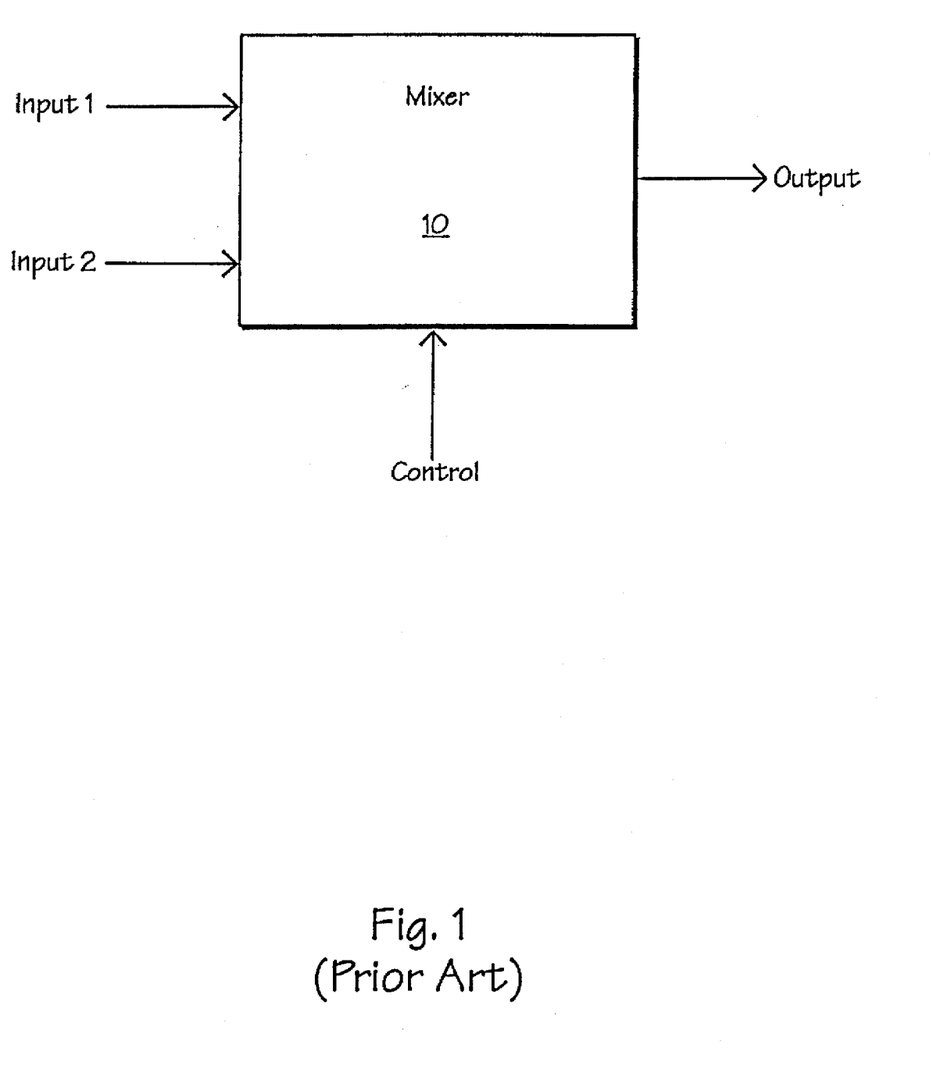
FIG. 1 illustrates a video mixer circuit of the prior art which mixes two input signals together in a predetermined ratio.

A well known mixer circuit, as illustrated in FIG. 1, mixes two input signals together in a predetermined ratio forming an output signal. The mixing of the two input signals is controlled by a control signal which specifies the ratio of the input signals. Input signals Input1 and Input2 are coupled as inputs to the mixer circuit 10. A control signal Control is coupled as a control input to the mixer circuit 10 for controlling the mixing ratio of the two input signals Input1 and Input2. The mixer circuit 10 outputs an output signal Output which is a combination of the two input signals Input1 and Input2 in a predetermined ratio, as specified by the control signal Control. In this manner the mixer circuit 10 combines the two input signals Input1 and Input2 into a single output signal Output.

When either or both of the two input signals Input1 and Input2 are provided to the mixer circuit 10 from another integrated circuit, noise may be introduced into the output signal Output causing the output signal Output to be in error or perhaps distorted. This noise can result because the level of the input signals Input1 and Input2 will each be in reference to a different ground reference signal, i.e., from each of the separate integrated circuits. The mixer circuit 10 has a separate ground reference signal. Each of the ground reference signals corresponding to each of the input signals Input1 and Input2 may be different than the ground reference signal of the mixer circuit 10. Thus, the level of each input signal Input1 and Input2 may be correct with respect to its own ground reference signal but may be in error with respect to the ground reference signal of the mixer circuit 10. Accordingly, when the input signals Input1 and Input2 are combined by the mixer circuit 10 generating the output signal Output, the different ground reference levels of each of the signals, will cause noise or distortion to be introduced into the output signal Output. This noise or distortion will negatively impact the quality of the output signal Output.

SUMMARY OF THE INVENTION

A mixer control circuit generates content control signals which are used by a mixer circuit to control the content of an output signal. The output signal will include either an analog signal, a digital signal or a mixture of the analog and digital signals. The level of a digital content control signal corresponds to the percentage of the output signal which includes the digital signal. The level of an analog content control signal corresponds to the percentage of the output signal which includes the analog signal. When the output signal includes a mixture of the analog and digital signals, a differential pair and an external control voltage are used to specify the percentage of each signal to be included within the output signal. During a horizontal blanking period, when the signals are being mixed, the differential pair and the external control voltage are bypassed and only the analog signal is included within the output signal. When the output signal is to include only one of the signals, either analog or digital, the differential pair and the external control voltage are also bypassed. A switching network is used to control the generation of the content control signals. The switching network is controlled by a control logic circuit in response to the levels of two control signals and a horizontal blanking signal.

DETAILED DESCRIPTION OF THE PREFERRED EMBODIMENT

Figure 2:
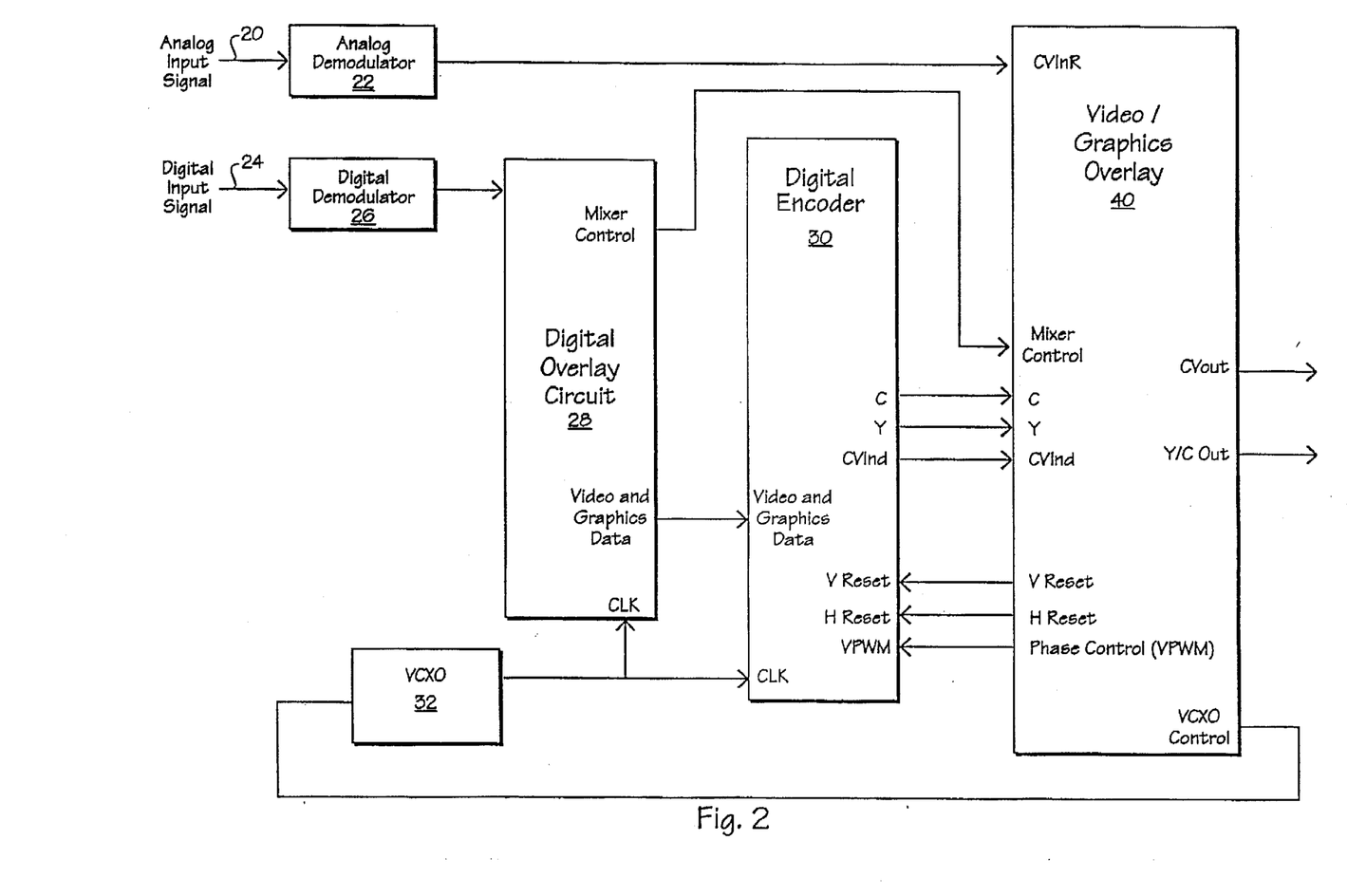
FIG. 2 illustrates a block diagram schematic of a video display system according to the present invention.

A block diagram schematic of a video display system including a video/graphic overlay circuit of which the mixer control circuit of the present invention is a part, is illustrated in FIG. 2. An analog input video signal is input to the analog demodulator 22 on a signal line 20. An output of the analog demodulator 22 is coupled as an analog input composite video signal CVInR to a video/graphics overlay integrated circuit 40. A digital input video signal is input to a digital demodulator 26 on a signal line 24. An output of the digital demodulator 26 is coupled as an input to a digital overlay control circuit 28. A video and graphics data output of the digital overlay control circuit 28 is coupled as an input to a digital encoder 30 to provide the digital video signal to the digital encoder 30. A mixer control output of the digital overlay circuit 28 is coupled as an input to the video/graphics overlay integrated circuit 40. A voltage controlled oscillator (VCXO) 32 is coupled to provide a clock input signal to the digital overlay control circuit 28 and the digital encoder integrated circuit 30. The VCXO 32 is controlled by a control signal VCXO Control output from the video/graphics overlay integrated circuit 40.

The digital encoder integrated circuit 30 encodes the video and graphics data received from the digital overlay control circuit 28 into an analog format composite video signal, which will be referred to as a digital input composite video signal CVInd, or a Y/C video signal (S-Video), depending on the format of the video and graphics data input. The digital encoder integrated circuit 30 is coupled to provide the digital input composite video signal CVInd, a separate chrominance output signal C and a separate luminance output signal Y, as inputs to the video/graphics overlay integrated circuit 40. The video/graphics overlay integrated circuit 40 is coupled to provide control signals VReset, HReset and Phase Control (VPWM) as inputs to the digital encoder integrated circuit 30.

The video/graphics overlay integrated circuit 40 is configured to receive the analog input composite video signal CVInR and the digital input composite video signal CVInd which are combined in a predetermined format into an output composite video signal CVout by a mixer circuit controlled by the mixer control circuit of the present invention. The video/graphics overlay integrated circuit 40 is configured for providing the output composite video signal CVout to a display system, such as a television. The video/graphics overlay integrated circuit 40 also provides Y/C video output signals to output a Y/C format video signal. If a Y/C format video signal is received by the video/graphics overlay integrated circuit 40 from the digital encoder integrated circuit 30 then the video/graphics overlay integrated circuit 40 will pass the Y and C signals through to the Y/C output and provide them in a purely digital format.

The digital video signal may comprise digital video, graphics data or both. In the preferred embodiment of the present invention, the output signal CVout may contain any of analog video only, analog video with graphics, digital video only, digital video with graphics and graphics only. The contents of the output signal CVout and the mixture or ratio of the output is controlled by the mixer control signals provided from the digital overlay control circuit 28. As specified by the mixer control signals, the mixture of the signals within the output composite video signal CVout is performed by the mixer circuit and controlled by the mixer control circuit of the present invention.

The digital video and graphics data are encoded into an analog format composite video signal using the digital encoder integrated circuit 30 and output as the digital input composite video signal CVInd. This output is coupled to the video/graphics overlay integrated circuit 40. If the composite video output signal CVout is to contain both analog and digital video information, then the analog video signal CVInR and the digital composite video signal CVInd are combined by the video/graphics overlay integrated circuit 40 using a predetermined ratio of signals, as specified by the mixer control signals, and output as the analog format composite video output signal CVout. It should be understood that when the digital input composite video signal CVInd is discussed herein an analog format composite video signal representing the digital video and graphics signal received by the digital encoder integrated circuit 30 from the digital overlay control circuit 28 is being referred to.

When only a pure analog video signal is to be output by the video/graphics overlay integrated circuit 40, the analog input video signal CVInR is passed through the video/graphics overlay integrated circuit 40 and output as the composite video output signal CVout, without any mixing or encoding. Correspondingly, when only a pure digital, graphics or combined digital and graphics signal is to be output by the video/graphics overlay integrated circuit 40, the digital composite video signal CVInd, received from the digital encoder integrated circuit 30, is passed through the video/graphics overlay integrated circuit 40 and output as the composite video output signal CVout, without any mixing. When the mixer control signals specify that the composite video output signal CVout is to contain a predetermined portion of the analog input composite video signal CVInR and a predetermined portion of the digital input composite video signal CVInd, then the signals CVInR and CVInd are combined by the mixer circuit within the video/graphics overlay integrated circuit 40 into the output composite video signal CVout.

The mixer control signals include three signal lines M0, M1 and $\alpha$. The signals M0 and M1 specify the content of the output composite video signal CVout and the signal $\alpha$ specifies the ratio of the analog input composite video signal CVInR to the digital input composite video signal CVInd, if both are to be combined. If a digital input video signal and graphics are to be combined into the digital input composite video signal, this is done by the digital overlay control circuit 28 and provided to the digital encoder integrated circuit 30 at the video and graphics data input. The following table illustrates the relationship of the mixer signals M0, M1 and $\alpha$ to the contents of the output composite video signal CVout.

TABLE I

| M0 | M1 | CVout |
|---|---|---|
| L | L | CVout=$\alpha$CVInR + (1-$\alpha$)CVInd |
| H | L | CVout=CVInR |
| L | H | CVout=CVInd |
| H | H | Not used |

As Table I illustrates, when both of the mixer control signals M0 and M1 are at a logical low voltage level the output composite video signal CVout is comprised of a level of the analog input composite video signal CVInR equal to the level of the signal $\alpha$ and a level of the digital input composite video signal CVInd equal to the level of one minus the level of the signal $\alpha$. When the mixer control signal M0 is at a logical high voltage level and the mixer control signal M1 is at a logical low voltage level the output composite video signal CVout is comprised of only the analog input composite video signal CVInR. When the mixer control signal M0 is at a logical low voltage level and the mixer control signal M1 is at a logical high voltage level the output composite video signal CVout is comprised of only the digital input composite video signal CVInd.

Figure 3:
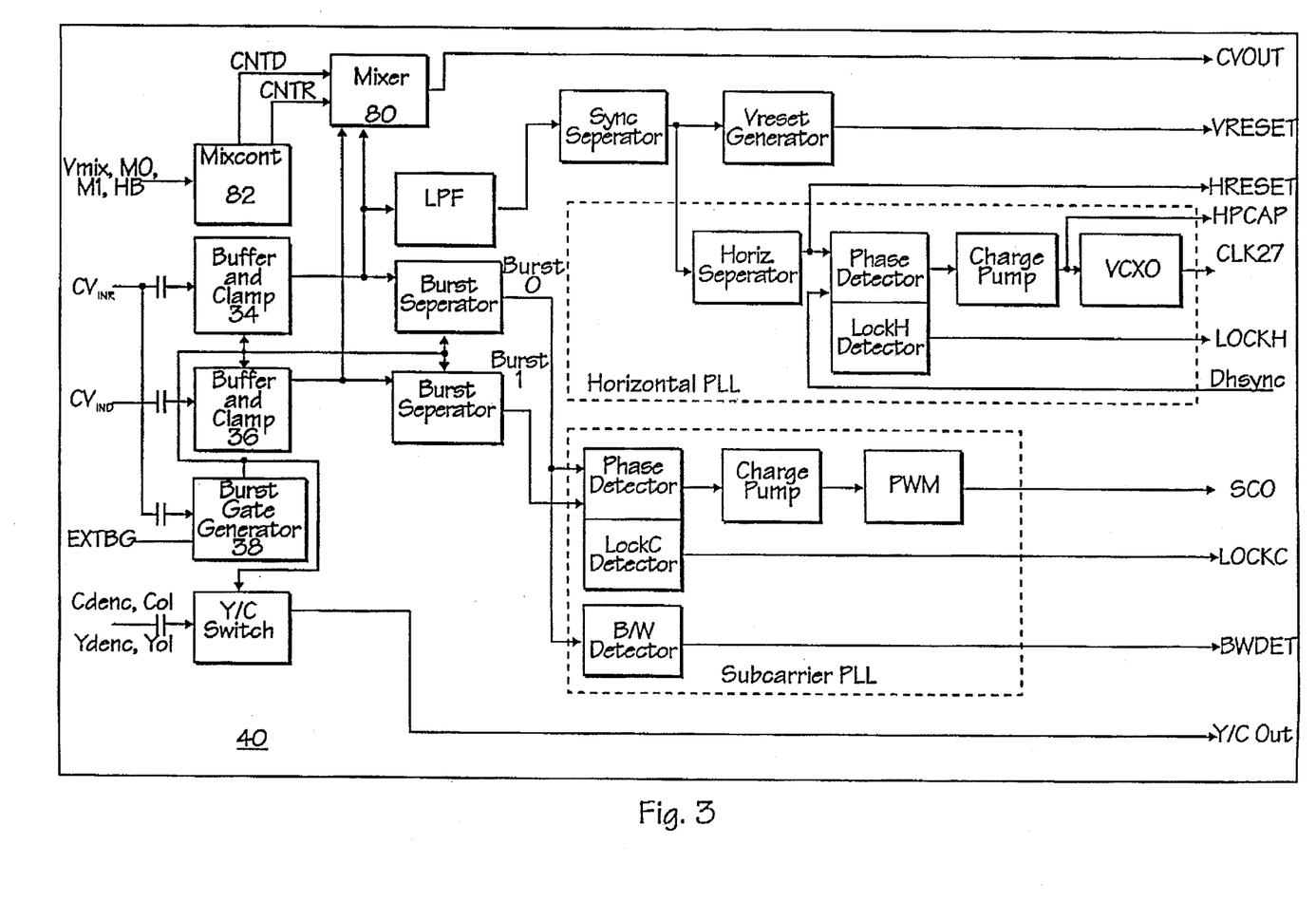
FIG. 3 illustrates a block diagram schematic of a video/graphics overlay circuit according to the present invention.

A schematic block diagram of the video/graphics overlay circuit 40 of the present invention is illustrated in FIG. 3. The analog input composite video signal CVInR is received from the analog demodulator 22 and coupled as an input to a buffer and clamp circuit 34 and as an input to a burst gate generator circuit 38. The digital input composite video signal CVInd is received from the digital encoder circuit 30 and coupled as an input to a buffer and clamp circuit 36.

The mixer control signals Vmix, M0 and M1 and a horizontal blanking signal HB are coupled as inputs to the mixer control circuit 82. The mixer control signal Vmix is an external control signal and corresponds to the signal α, discussed above, which specifies the mixing ratio of the two input composite video signals CVInR and CVInd. The content control signals CNTD and CNTR generated by the mixer control circuit 82 are coupled as inputs to a mixer circuit 80. The mixer control circuit 82 generates the content control signals CNTD and CNTR to control the mixer circuit 80 based on the state of the mixer control signals Vmix, M0 and M1.

The video/graphics overlay circuit 40 receives the analog input composite video signal CVInR and the digital input composite video signal CVInd and combines them in a predetermined format into the output composite video signal CVOut. The analog input composite video signal CVInR and the digital input composite video signal CVInd are combined by the mixer circuit 80. The content control signal CNTD specifies the content of the output composite video signal CVout which is to be represented by the digital composite video signal CVInd. The content control signal CNTR specifies the content of the output composite video signal CVout which is to be represented by the analog composite video signal CVInR. The mixer control circuit 82 of the present invention receives the control input signals Vmix, M0 and M1 and will control the mixer circuit 80 through the content control signals CNTR and CNTD, according to the states of those signals, as described above and illustrated in Table I. The output composite video signal CVout is then transmitted to a video display device such as a television or monitor.

The mixer circuit 80 combines the analog input composite video signal CVInR and the digital input composite video signal CVInd into the output composite video signal CVout in a predetermined ratio, as specified by the content control signals CNTR and CNTD. The content control signals CNTR and CNTD are generated in response to the mixer control signals Vmix, M0 and M1. The mixer control signal Vmix corresponds to the mixer control signal α, discussed above, and specifies the ratio of the input signals. Table I above illustrates the relationship of the mixer signals Vmix, M0 and M1 to the contents of the output composite video signal CVout. The mixer circuit 80 of the preferred embodiment includes common-mode noise rejection to reduce the effect of noise within the output composite video signal CVout. Because the input video signals CVInR and CVInd are provided from different integrated circuits with potentially different ground levels, the input signals CVInR and CVInd and their respective ground signals are all coupled to the mixer circuit 80. The mixer circuit eliminates common-mode noise within the output composite video signal CVout, caused by each input signal having a different ground reference signal, by passing each input signal differentially.

This is achieved using a standard Gilbert Cell. The content control signals CNTD and CNTR output from the mixer control circuit 82 of the present invention are coupled as inputs to the Gilbert Cell for controlling the ratio of the input signals CVInR and CVInd included within the output composite video signal CVout. The Gilbert Cell receives the differential input signals CVInR and CVInd and outputs a differential output signal comprised of a predetermined ratio of the input signals as specified by the content control signals CNTD and CNTR received from the mixer control circuit 82. The differential output signal is then converted to a single ended output signal. After being converted to a single ended output voltage, the single ended output signal is passed through an output buffer and provided as the output composite video signal CVout. A preferred embodiment of the mixer circuit 80 is described in co-pending U.S. patent application Ser. No. 08/584,926, filed on the same date as the present application and entitled "Mixer With Common-Mode Noise Rejection," which is hereby incorporated by reference.

Figure 6:
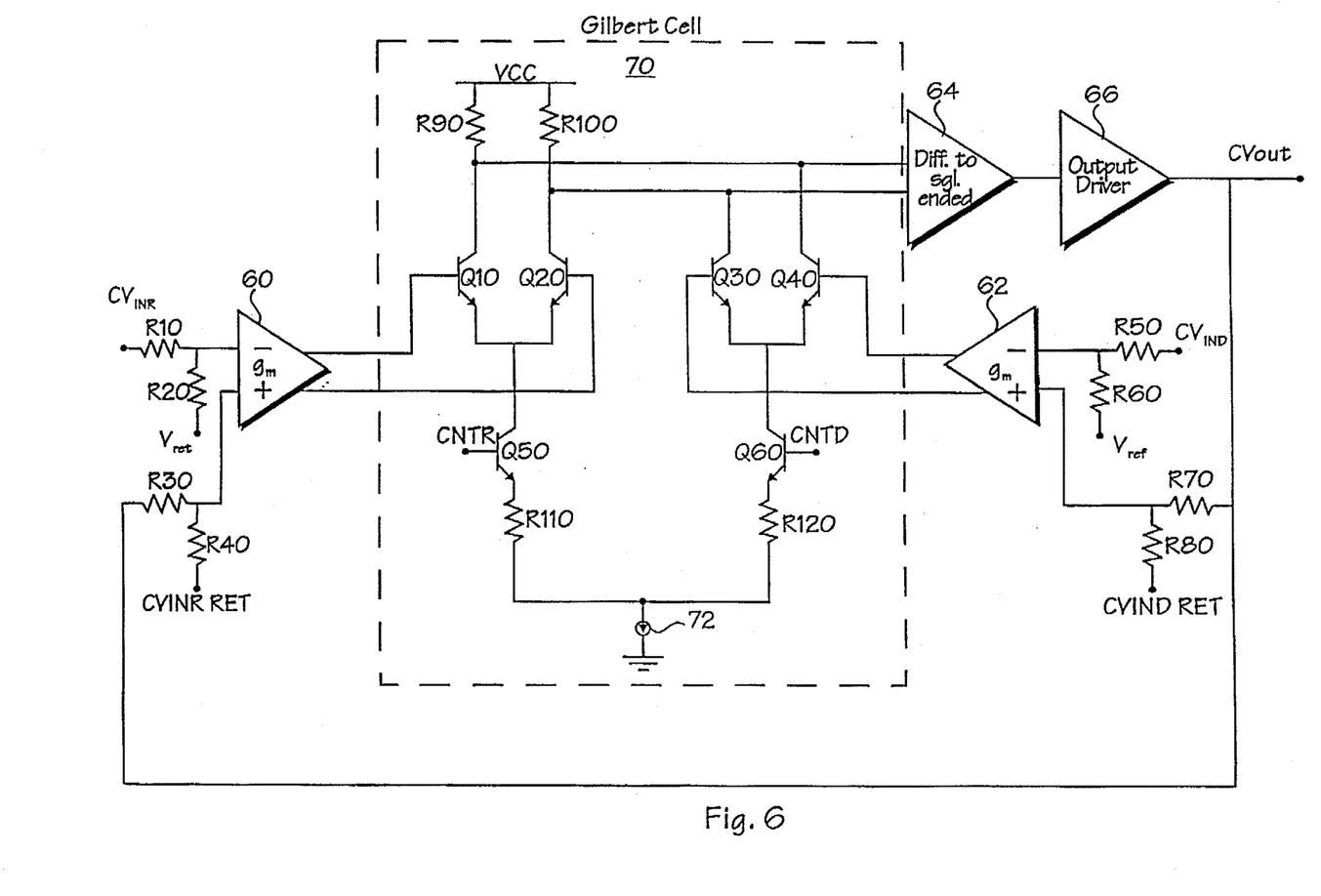
FIG. 6 illustrates a detailed schematic of the preferred embodiment of the mixer.

A detailed schematic block diagram of the mixer circuit 80 is illustrated in FIG. 6. The analog input composite video signal CVInR is coupled to the first terminal of a resistor R10. The second terminal of the resistor R10 is coupled to the first terminal of a resistor R20 and to the inverting input of a transconductance amplifier stage 60. The second terminal of the resistor R20 is coupled to the ground reference signal Vref of the mixer circuit. The digital input composite video signal CVInd is coupled to the first terminal of a resistor R50. The second terminal of the resistor R50 is coupled to the first terminal of a resistor R60 and to the inverting input of a transconductance amplifier stage 62. The second terminal of the resistor R60 is coupled to the ground reference signal Vref of the mixer circuit.

The analog input composite video ground reference signal CVInR Ret is coupled to the first terminal of a resistor R40. The analog input composite video ground reference signal CVInR Ret is input to the video/graphics overlay integrated circuit 40 with the analog input composite video signal CVInR from the analog demodulator circuit 22. The second terminal of the resistor R40 is coupled to the non-inverting input of the transconductance amplifier 60 and to the first terminal of a resistor R30. The digital input composite video ground reference signal CVInd Ret is coupled to the first terminal of a resistor R80. The digital input composite video ground reference signal CVInd Ret is input to the video/graphics overlay integrated circuit 40 with the digital input composite video signal CVInd from the digital encoder integrated circuit 30. The second terminal of the resistor R80 is coupled to the non-inverting input of the transconductance amplifier 62 and to the first terminal of a resistor R70.

The differential output from the transconductance amplifier 60 representing the analog input composite video signal CVInR is input to the Gilbert Cell mixing circuit 70 and coupled differentially to the base of an npn transistor Q10 and to the base of an npn transistor Q20. The differential output from the transconductance amplifier 62 representing the digital input composite video signal CVInd is input to the Gilbert Cell mixing circuit 70 and coupled differentially to the base of an npn transistor Q30 and to the base of an npn transistor Q40. The Gilbert Cell mixing circuit 70 is a standard Gilbert Cell which accepts the differential input signals, mixes them in a ratio controlled by the content signals CNTR and CNTD and outputs a differential output signal. Together, the transistors Q10 and Q20 form a differential pair. The transistors Q30 and Q40 also form a differential pair.

The collector of the transistor Q10 is coupled to the first terminal of a resistor R90, to the collector of the transistor Q40 and to the input of a differential-to-single ended amplifier circuit 64. The collector of the transistor Q20 is coupled to the first terminal of a resistor R100, to the collector of the transistor Q30 and to the input of the differential-to-single ended amplifier circuit 64. The second terminal of the resistor R90 and the second terminal of the resistor R100 are coupled to a supply voltage VCC. The emitter of the transistor Q10 is coupled to the emitter of the transistor Q20 and to the collector of an npn transistor Q50. The emitter of the transistor Q50 is coupled to the first terminal of a resistor R110. The content signal CNTR is coupled to the base of the transistor Q50. The emitter of the transistor Q30 is coupled to the emitter of the transistor Q40 and to the collector of an npn transistor Q60. The emitter of the transistor Q60 is coupled to the first terminal of a resistor R120. The content signal CNTD is coupled to the base of the transistor Q60. The second terminal of the resistor R110 is coupled to the second terminal of the resistor R120 and to the first terminal of a current source 72. The second terminal of the current source 72 is coupled to ground.

The differential output of the Gilbert Cell 70 is coupled as a differential input to the differential-to-single ended amplifier circuit 64. The single ended output of the differential-to-single ended amplifier 64 is coupled as an input to the output driver circuit 66. The output of the output driver circuit 66 provides the output composite video signal CVout. The output of the output driver circuit 66 is coupled to the second terminal of the resistor R30 and to the second terminal of the resistor R70 to provide a feedback path from the output.

The analog input composite video signal CVInR is clean with respect to its corresponding ground signal CVInR Ret but may be extremely noisy with respect to the ground reference signal Vref of the mixer circuit 80. The digital input composite video signal CVInd is clean with respect to its corresponding ground signal CVInd Ret but may also be extremely noisy with respect to the ground reference signal Vref of the mixer circuit 80. For these reasons and in order to minimize the noise within the composite video output signal CVout the mixer circuit 80 of the present invention receives both the composite video signals CVInR and CVInd as well as their respective ground signals CVInR Ret and CVInd Ret as inputs. The mixer circuit 80 then eliminates the common mode noise due to each signal having a different ground signal by subtracting the respective ground reference signals from the appropriate composite video signals using a differential amplifier and then combining the input composite video signals into a combined output composite video signal. The mixer circuit 80 mixes the composite video signals CVInR and CVInd as specified by the content signals CNTR and CNTD. Once the signals are combined, the differential output of the mixer circuit 80 is converted to a single ended output, passed through an output driver 66 and output as the composite video output signal CVout.

The mixer control circuit 82 of the present invention receives the mixer control signals Vmix, M0 and M1 and the horizontal blanking signal HB and controls the mixing of the composite video signals CVInR and CVInd by the mixer circuit 80 through the content control signals CNTD and CNTR. The mixer control circuit 82 provides the content control signals CNTR and CNTD to the mixer circuit 80 representing the percentage of the analog composite video signal CVInR and the percentage of the digital composite video signal CVInd, respectively, which are to be included within the output composite video signal CVout. The mixer circuit 80 then mixes the two composite video signals CVInR and CVInd in the ratio specified by the content control signals CNTR and CNTD received from the mixer control circuit 82 into the output composite video signal CVout.

As illustrated in Table I above, when the control signal M0 is at a logical high voltage level and the control signal M1 is at a logical low voltage level, the analog composite video signal CVInR is passed through the mixer circuit 80 and output as the output composite video signal CVout. When the control signal M0 is at a logical low voltage level and the control signal M1 is at a logical high voltage level, the digital composite video signal CVInd is passed through the mixer circuit 80 and output as the output composite video signal CVout. When both of the control signals M0 and M1 are at a logical low voltage level, the mixer circuit 80 mixes the composite video signals CVInR and CVInd in a ratio specified by the control signal Vmix and controlled by the mixer control circuit 82. The resulting signal is provided as the output composite video signal CVout.

The external control voltage Vmix is used by the mixer control circuit 82 to represent the ratio α when the composite video signals CVInR and CVInd are to be mixed. The ratio α is some value less than or equal to one which represents the percentage of the output composite video signal CVout which is to be comprised of the analog composite video signal CVInR. This analog content percentage is specified by the content control signal CNTR provided from the mixer control circuit 82 to the mixer circuit 80. A value of one minus the ratio α represents the percentage of the output composite video signal CVout which is to be comprised of the digital composite video signal CVInd. This digital content percentage is specified by the content control signal CNTD provided from the mixer control circuit 82 to the mixer circuit 80. Together, the percentage of the analog composite video signal CVInR, specified by the content control signal CNTR, and the percentage of the digital composite video signal CVInd, specified by the content control signal CNTD, will always equal one.

In the preferred embodiment of the present invention, the external control voltage Vmix varies from a value of 1.5 volts, when the ratio α is equal to zero, to a value of 2.5 volts, when the ratio α is equal to one. When the ratio α is equal to zero, the digital composite video signal CVInd is output as the output composite video signal CVout. When the ratio α is equal to one, the analog composite video signal CVInR is output as the output composite video signal CVout. When the external control voltage Vmix is between 1.5 volts and 2.5 volts, the composite video signals CVInR and CVInd are mixed together in a proportional amount, determined by the value of the external control voltage Vmix.

The content control signals CNTD and CNTR are analog signals and specify the percentage of the output composite video signal CVout which is to be represented by each of the composite video signals CVInd and CVInR, respectively. When the composite video signals CVInR and CVInd are to be mixed, the level of the content control signal CNTR varies as the value of the ratio α varies and the level of the content control signal CNTD varies as the value of one minus the ratio α varies.

When the two composite video signals CVInR and CVInd are being mixed, it is not desirable to also mix the sync pulse and burst signal of the composite video signals CVInR and CVInd. Therefore, during the horizontal blanking period of the signals, when the signal HB is at a logical low voltage level, the content control signals CNTR and CNTD specify that only the analog composite video signal CVInR is to be output as the output composite video signal CVout, no matter what the value of the external control voltage Vmix. During the horizontal blanking period the content control signal CNTR will be at a logical high voltage level and the content control signal CNTD will be at a logical low voltage level. At the end of the horizontal blanking period, when the signal HB rises to a logical high voltage level, the composite video signals CVInR and CVInd are again mixed by the mixer circuit 80, as specified by the content control signals CNTR and CNTD provided from the mixer control circuit 82.

When the output composite video signal CVout includes only one of the composite video signals CVInR or CVInd it may be necessary to switch rapidly to the other one of the composite video signals CVInR and CVInd. The mixer control circuit 82 of the present invention allows for rapid switching between the composite video signals CVInR and CVInd by using a switching network to control the generation of the content control signals CNTR and CNTD. The switching network controls the content control signals CNTR and CNTD to allow only the analog composite video signal CVInR, only the digital composite video signal CVInd or a mixture of both the composite video signals CVInR and CVInd to be included within the output composite video signal CVout. The external control voltage Vmix is only used when the output composite video signal CVout does not include a mixture of the composite video signals CVInR and CVInd and is otherwise bypassed.

Figure 4:
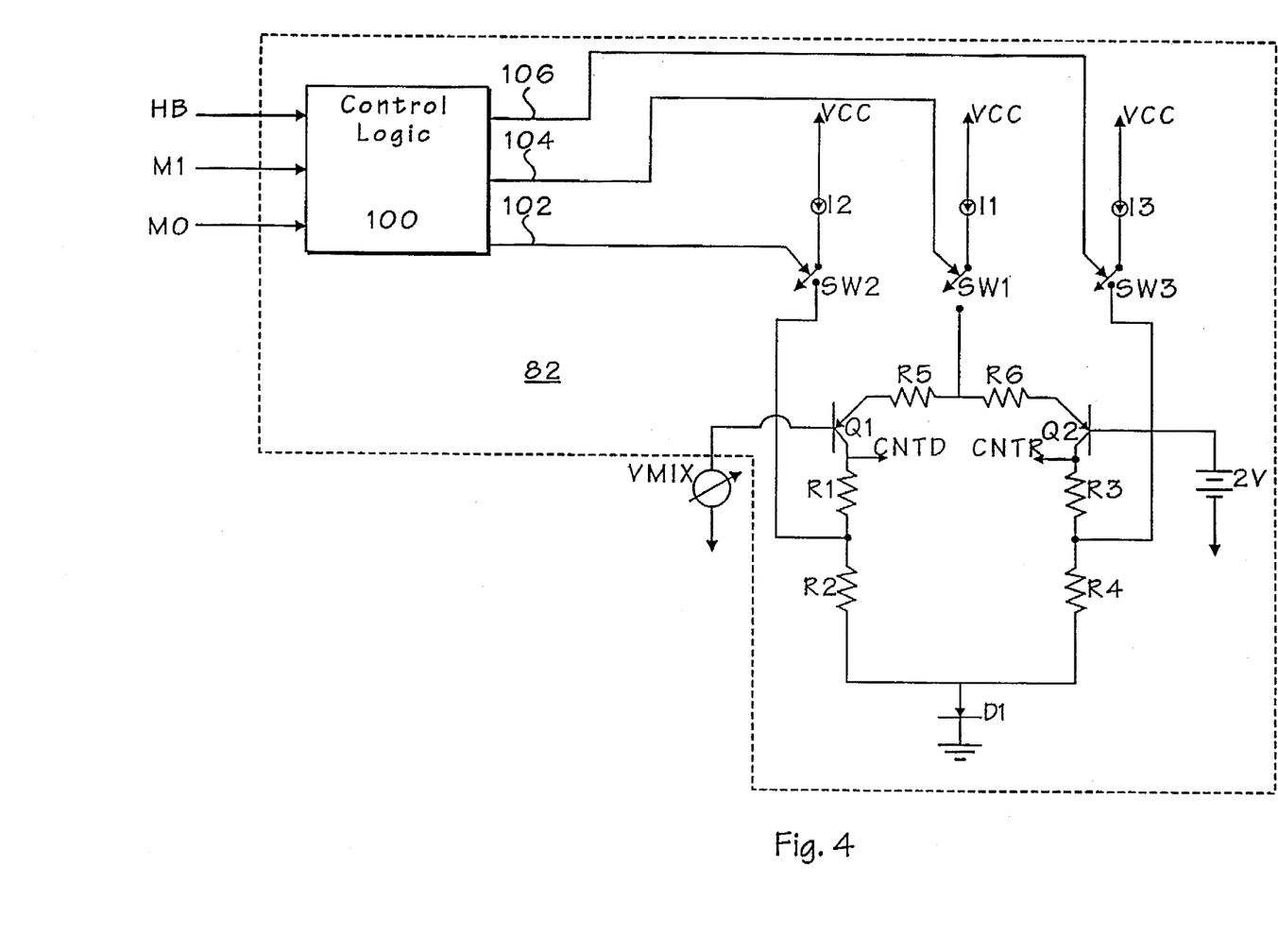
FIG. 4 illustrates a block diagram schematic of the mixer control circuit of the present invention.

A block diagram schematic of the mixer control circuit 82 of the present invention is illustrated in FIG. 4. The control signals M0 and M1 and the horizontal blanking signal HB are coupled as inputs to a control logic circuit 100. The control logic circuit 100 generates three output control signals 102, 104 and 106 in response to the status of the control signals M0 and M1 and the horizontal blanking signal HB, as will be described below. The control signal 102 is coupled to control the operation of a switch SW2. The control signal 104 is coupled to control the operation of a switch SW1. The control signal 106 is coupled to control the operation of a switch SW3.

The first terminal of a current source I1 is coupled to the supply voltage VCC. The second terminal of the current source I1 is coupled to a first terminal of the switch SW1. A second terminal of the switch SW1 is coupled to the first terminal of a resistor R5 and to the first terminal of a resistor R6. The second terminal of the resistor R5 is coupled to the emitter of a pnp transistor Q1. The second terminal of the resistor R6 is coupled to the emitter of a pnp transistor Q2. The external control voltage Vmix is coupled to the base of the transistor Q1. A constant two-volt voltage source is coupled to the base of the transistor Q2. The collector of the transistor Q1 is coupled to the first terminal of a resistor R1 and configured to provide the digital content control signal CNTD to the mixer circuit 80. The collector of the transistor Q2 is coupled to the first terminal of a resistor R3 and configured to provide the analog content control signal CNTR to the mixer circuit 80. Together the transistor Q1 and the transistor Q2 form a differential pair.

The first terminal of a current source I2 is coupled to the supply voltage VCC. The second terminal of the current source I2 is coupled to a first terminal of the switch SW2. A second terminal of the switch SW2 is coupled to the second terminal of the resistor R1 and to the first terminal of a resistor R2. The first terminal of a current source I3 is coupled to the supply voltage VCC. The second terminal of the current source I3 is coupled to a first terminal of the switch SW3. A second terminal of the switch SW3 is coupled to the second terminal of the resistor R3 and to the first terminal of a resistor R4. The second terminal of the resistor R2 is coupled to the second terminal of the resistor R4 and to the anode of a diode D1. A cathode of the diode D1 is coupled to ground.

The control logic circuit 100 generates the control signals 102, 104 and 106 to control the switches SW2, SW1 and SW3, respectively, according to the state of the control signals M0 and M1 and of the horizontal blanking signal HB. The content control signals CNTR and CNTD are generated according to the state of the switches SW1, SW2 and SW3 and when the composite video signals CVInR and CVInd are being mixed, of the external control voltage Vmix. The following table illustrates the relationship of the state of the switches SW1, SW2 and SW3 to the state of control signals M0 and M1 and the horizontal blanking signal HB, as controlled by the control logic circuit 100.

TABLE II

| M1 | M0 | HB | SW1 | SW2 | SW3 | CNTD | CNTR | Action |
|---|---|---|---|---|---|---|---|---|
| 0 | 0 | 0 | OFF | OFF | ON | HIGH | LOW | CVInR |
| 0 | 0 | 1 | ON | OFF | OFF | f(Vmix) | f(Vmix) | Mixture of CVInR & CVInd |
| 0 | 1 | X | OFF | OFF | ON | HIGH | LOW | CVInR |
| 1 | 0 | X | OFF | ON | OFF | LOW | HIGH | CVInd |
| 1 | 1 | X | X | X | X | X | X | Not Allowed |

As illustrated in Table II, during non-horizontal blanking periods when the horizontal blanking signal HB is at a logical high voltage level and the control signals M1 and M0 are both at a logical low voltage level, the switch SW1 is on, the switches SW2 and SW3 are off and the content control signals CNTD and CNTR are a function of the difference between the external control voltage signal Vmix and the two-volt constant voltage supply. The current source I1 is supplying current to the differential pair comprised of the transistors Q1 and Q2. The level of the current flowing through the collector of each of the transistors Q1 and Q2 is directly related to the level of its base voltage with respect to the base voltage of the other transistor. Accordingly, when the external control voltage Vmix is equal to two volts, the level of current flowing through the collectors of the transistors Q1 and Q2 is equal and the content control signals CNTD and CNTR will also have an equal value. If the value of the external control voltage Vmix falls below the two volt level, then the level of the content control signal CNTD will be proportionately higher than the level of the content control signal CNTR. When the external control voltage Vmix is equal to 1.5 volts, the level of the content control signal CNTD is equal to a logical high voltage level and the level of the content control signal CNTR is equal to a logical low voltage level. At this point, the output composite video signal CVout comprises only the digital composite video signal CVInd. If the value of the external control voltage Vmix rises above the two volt level, the level of the content control signal CNTD will be proportionately lower than the level of the content control signal CNTR. When the external control voltage Vmix is equal to 2.5 volts, the level of the content control signal CNTD is equal to a logical low voltage level and the level of the content control signal CNTR is equal to a logical high voltage level. At this point, the output composite video signal CVout comprises only the analog composite video signal CVInR.

When the control signals M0 and M1 are both at a logical low voltage level and the horizontal blanking signal HB falls to a logical low voltage level, during a horizontal blanking period, the switch SW1 is turned off and the switch SW3 is turned on. When the switch SW3 is turned on, the current source I3 supplies current to the resistor R4 and thereby raises the voltage level of the content control signal CNTR to a logical high voltage level. Because there is no current flowing through the resistors R1 and R2, the content control signal CNTD is at a logical low voltage level. Accordingly, during a horizontal blanking period, the output composite video signal CVout will comprise only the analog composite video signal CVInR. At the end of the horizontal blanking period, if the control signals M0 and M1 are still both at a logical low voltage level, the switch SW3 is turned off and the switch SW1 is turned on so that the content control signals CNTD and CNTR will again be a function of the difference between the external control voltage Vmix and the two-volt constant voltage supply.

When the control signal M0 is at a logical high voltage level and the control signal M1 is at a logical low voltage level, the output composite video signal CVout comprises only the analog composite video signal CVInR. The switch SW3 is therefore turned on and the switches SW1 and SW2 are turned off. When the switch SW3 is turned on, the current source I3 supplies current to the resistor R4 and thereby raises the voltage level of the content control signal CNTR to a logical high voltage level. Because there is no current flowing through the resistors R1 and R2, the content control signal CNTD is at a logical low voltage level. During this period, because the composite video signals CVInR and CVInd are not being mixed, it does not matter what state the horizontal blanking signal HB is in.

When the control signal M0 is at a logical low voltage level and the control signal M1 is at a logical high voltage level, the output composite video signal CVout is to comprise only the digital composite video signal CVInd. The switch SW2 is turned on and the switches SW1 and SW3 are turned off. When the switch SW2 is turned on, the current source I2 supplies current to the resistor R2 and thereby raises the voltage level of the content control signal CNTD to a logical high voltage level. Because there is no current flowing through the resistors R3 and R4, the content control signal CNTR is at a logical low voltage level. During this period, because the composite video signals CVInR and CVInd are not being mixed, it does not matter what state the horizontal blanking signal HB is in. The control signals M0 and M1 are not allowed to both be at a logical high voltage level at the same time. Such a condition will create an invalid state within the control logic circuit 100.

In this manner, the mixer control circuit 82 of the present invention generates the content control signals CNTD and CNTR which are input to the mixer circuit 80 and used by the mixer circuit 80 to control the content of the output composite video signal CVout. When the output composite video signal CVout is to comprise a mixture of the analog and digital composite video signals CVInR and CVInd, a differential pair and an external control voltage Vmix are used to specify the percentage of each signal to be included within the output composite video signal CVout. During a horizontal blanking period, the differential pair and the external control voltage Vmix are bypassed and only the analog composite video signal CVInR is included within the output composite video signal.

When the output composite video signal CVout includes only one of the composite video signals CVInR or CVInd, the differential pair and the external control voltage Vmix are also bypassed. This allows the system to switch between the composite video signals CVInR and CVInd rapidly. A switching network, comprising three switches, is used to control the generation of the content control signals CNTD and CNTR and to switch between the states. The switching network is controlled by a control logic circuit in response to the levels of the control signals M0 and M1 and the horizontal blanking signal HB.

Figure 5:
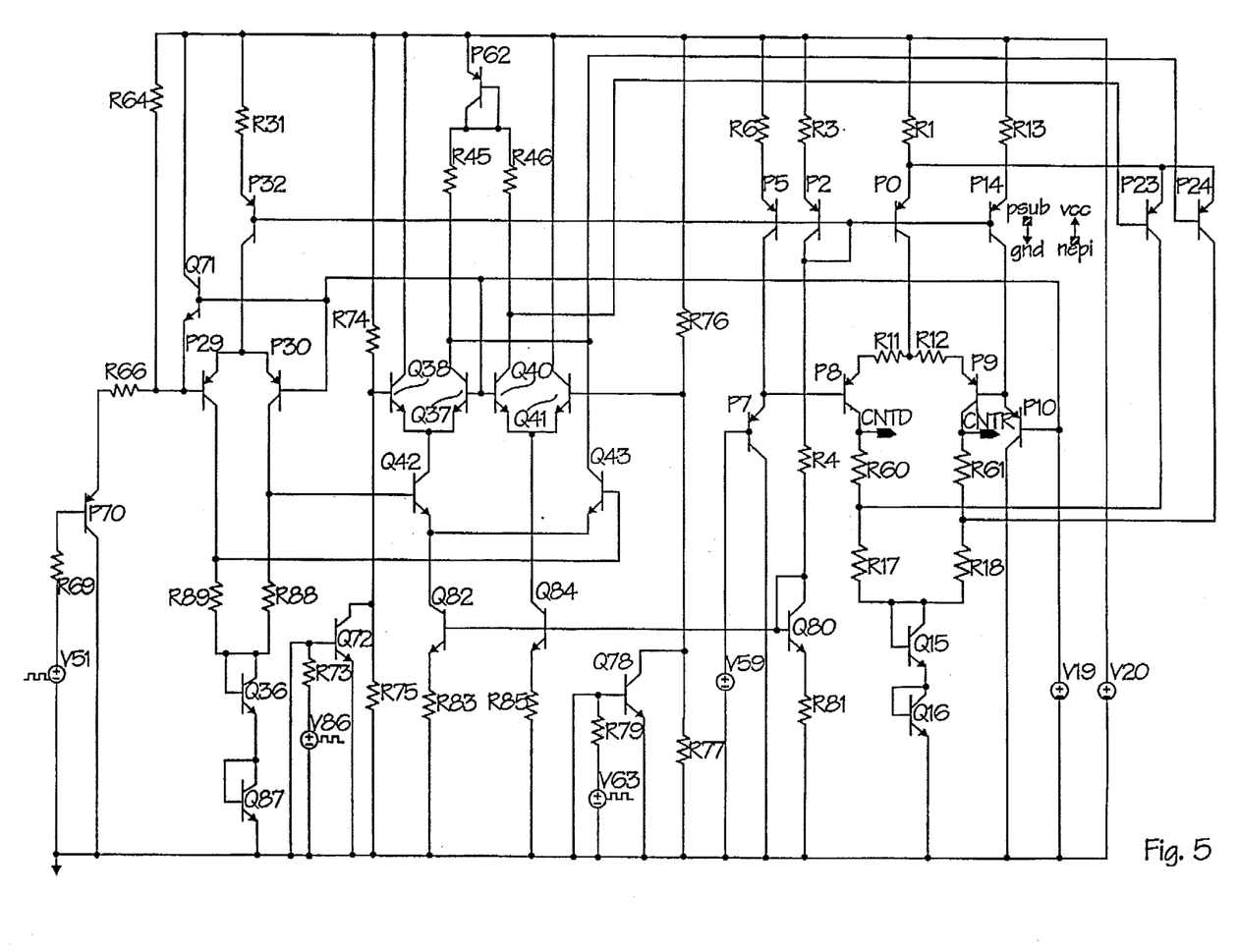
FIG. 5 illustrates a detailed circuit schematic of the preferred embodiment of the mixer control circuit.

A detailed circuit schematic of the preferred embodiment of the mixer control circuit 82 is illustrated in FIG. 5. The preferred embodiment of the present invention is implemented within a video/graphics overlay integrated circuit, Part No. CXA2015Q, which will be available from Sony Corporation of America, 3300 Zanker Road, San Jose, Calif. 95134. Within this integrated circuit, a mixer control circuit provides control signals to a mixer circuit which is used to mix an analog input composite video signal and a digital input composite video signal into a combined output composite video signal.

While the preferred embodiment of the present invention has been illustrated and described as an integrated circuit using bipolar transistors, it will be apparent to a person of ordinary skill in the art that the circuit of the present invention may be implemented using another device technology, including but not limited to CMOS, MOS, discrete components and ECL. It will also be apparent to those skilled in the art that different logic circuit configurations could be substituted for the logic circuit described above to perform the functions of the preferred embodiment.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chose for illustration without departing from the spirit and scope of the invention.

We claim:

1. A mixer control circuit for generating a plurality of content control signals used to control mixing of a plurality of input signals into an output signal, wherein each content control signal corresponds to one of the plurality of input signals and represents a percentage of the output signal which is to include the corresponding input signal, the mixer control circuit comprising:

a. a control logic circuit configured to receive a plurality of control signals specifying a selected one of a plurality of states, including a plurality of separate states, each for including only a corresponding one of the plurality of input signals separately as the output signal and a mixing state for mixing the plurality of input signals in a predetermined ratio into the output signal;

b. an output circuit configured for receiving an external control voltage and generating the plurality of content control signals, wherein the external control voltage represents the predetermined ratio during the mixing state; and c. a switching network controlled by the control logic circuit and coupled to the output circuit for controlling the generation of the plurality of content control signals depending on the state selected.

2. The mixer control circuit as claimed in claim 1 wherein the plurality of control signals includes a horizontal blanking signal which is active during a horizontal blanking period of one of the input signals.

3. The mixer control circuit as claimed in claim 2 wherein during the mixing state when the horizontal blanking signal is active, only a predetermined one of the input signals is included within the output signal.

4. The mixer control circuit as claimed in claim 3 wherein the plurality of input signals includes a first composite video signal and a second composite video signal and the plurality of content control signals includes a first content control signal corresponding to the first composite video signal and a second content control signal corresponding to the second composite video signal.

5. The mixer control circuit as claimed in claim 1 wherein the content control signals are provided to a mixer circuit for generating the output signal.

6. A method of generating an output signal composed of one or more of a plurality of input signals comprising the steps of:
   a. receiving a plurality of control signals specifying a selected one of a plurality of states including a plurality of separate states, each for including only a corresponding one of the plurality of input signals separately as the output signal and a mixing state for combining the plurality of input signals in a predetermined ratio into the output signal;
   b. generating a plurality of content control signals, each corresponding to an appropriate one of the plurality of input signals and each representing a percentage of the output signal which is to include the appropriate one of the input signals; and
   c. receiving a first signal which when active represents a first period during a selected one of the input signals, wherein during the mixing state when the first signal is active, only a predetermined one of the input signals is included within the output signal.

7. The method as claimed in claim 6 wherein the plurality of input signals includes a first composite video signal and a second composite video signal.

8. The method as claimed in claim 7 wherein the first signal is a horizontal blanking signal representing a horizontal blanking period in the first composite video signal.

9. A method of generating an output signal including one or more of a plurality of input video signals in a predetermined ratio, comprising the steps of:
   a. receiving a plurality of control signals and a horizontal blanking signal which when active represents a horizontal blanking period in a selective one of the input video signals;
   b. generating a plurality of content control signals, each corresponding to an appropriate one of the plurality of input video signals and representing a percentage of the output signal which is to include the appropriate one of the input video signals, wherein the output signal will include a selective one of the input video signals or a mixture in the predetermined ratio of the input video signals as specified by the control signals; and
   c. providing the content control signals to a mixer circuit for generating the output signal;
   wherein when the control signals specify that the output signal is to include a mixture of the input video signals and the horizontal blanking signal is active, the output signal will include only one of the input video signals.

10. The method as claimed in claim 9 wherein the predetermined ratio is specified by an external voltage.

11. A video mixer control circuit for generating a first content control signal corresponding to a first composite video signal and a second content control signal corresponding to a second composite video signal, the first and second content control signals representing a percentage of an output signal which is to include the respective corresponding composite video signal, the video mixer control circuit comprising:
   a. a control logic circuit configured to receive a horizontal blanking signal which is active during a horizontal blanking period of the first composite video signal and first and second content control signals, together specifying one of a plurality of states including a first state wherein the output signal includes the first composite video signal only, a second state wherein the output signal includes the second composite video signal only and a third state wherein the output signal includes a mixture in a predetermined ratio of both the first and second composite video signals;
   b. a switching network coupled to and controlled by the control logic circuit for switching between the plurality of states; and
   c. an output circuit coupled to and controlled by the switching network for generating the first and second content control signals according to the specified state, wherein when the third state is specified and the horizontal blanking signal is active only the first composite video signal is included within the output signal.

12. The video mixer circuit as claimed in claim 11 wherein the predetermined ratio is specified by an external control voltage coupled to the output circuit.

13. The video mixer circuit as claimed in claim 12 wherein the output circuit includes a differential pair.

14. The video mixer circuit as claimed in claim 13 wherein the external control voltage and the differential pair are bypassed during the first and second states.

15. The video mixer circuit as claimed in claim 14 wherein the switching network includes a first switch corresponding to the first state, a second switch corresponding to the second state and a third switch corresponding to the third state.

16. A video display system for receiving video input signals and generating an output video signal comprising:
   a. a first input video receiving circuit configured for receiving a first input signal and a first ground reference signal and generating a first differential signal representative of a difference between the first input signal and the first ground reference signal;
   b. a second input video receiving circuit configured for receiving a second input signal and a second ground reference signal and generating a second differential signal representative of a difference between the second input signal and the second ground reference signal;
   c. a mixer control circuit for generating a first content signal representative of a first percentage of the output video signal which is to include the first differential signal and a second content signal representative of a second percentage of the output video signal which is to include the second differential signal; and
   d. a mixing circuit coupled to receive the first and second content signals and the first and second differential signals for combining the first and second differential signals in a predetermined ratio and generating the output video signal.

17. The video display system as claimed in claim 16 wherein the mixing circuit comprises a Gilbert cell.

18. The video display system as claimed in claim 17 further comprising a converting circuit coupled to the mixing circuit for converting the output video signal from a differential signal to a single ended signal.

19. The video display system as claimed in claim 18 wherein the first input video receiving circuit comprises a first transconductance amplifier stage for generating the first differential signal.

20. The video display system as claimed in claim 19 wherein the second input video receiving circuit comprises a second transconductance amplifier stage for generating the second differential signal.

21. The video display system as claimed in claim 16 wherein the mixer control circuit includes a first state wherein the output video signal includes only the first input signal, a second state wherein the output video signal includes only the second input signal and a third state wherein the output video signal includes a mixture in the predetermined ratio of the first and second input signals.

22. The video display system as claimed in claim 21 wherein the predetermined ratio is specified by an external control voltage.

23. The video display system as claimed in claim 22 wherein during a horizontal blanking period of the first input signal, when the mixer control circuit is in the third state, the output video signal only includes the first input signal.

* * * * *